US008685786B2

(12) United States Patent
Kagawa et al.

(10) Patent No.: US 8,685,786 B2
(45) Date of Patent: Apr. 1, 2014

(54) METHOD OF MANUFACTURING A SEMICONDUCTOR MEMORY DEVICE HAVING A RESISTANCE CHANGE MEMORY LAYER

(71) Applicant: Sony Corporation, Tokyo (JP)

(72) Inventors: Yoshihisa Kagawa, Kanagawa (JP); Tetsuya Mizuguchi, Kanagawa (JP); Ichiro Fujiwara, Kanagawa (JP); Akira Kouchiyama, Kanagawa (JP); Satoshi Sasaki, Kanagawa (JP); Naomi Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/902,350

(22) Filed: May 24, 2013

(65) Prior Publication Data

US 2013/0256626 A1  Oct. 3, 2013

Related U.S. Application Data

(62) Division of application No. 12/819,874, filed on Jun. 21, 2010.

(30) Foreign Application Priority Data

Aug. 5, 2009 (JP) .................................. 2009-182036

(51) Int. Cl.
*H01L 29/02* (2006.01)

(52) U.S. Cl.
USPC .............. 438/102; 438/103; 438/104; 257/2; 257/3; 257/4; 257/5; 257/E29.002

(58) Field of Classification Search
USPC .................. 257/1–5, E29.002; 438/102–104; 365/163
See application file for complete search history.

(56) References Cited

U.S. PATENT DOCUMENTS

| 2006/0126423 | A1 | 6/2006 | Aratani et al. |
| 2009/0039337 | A1 | 2/2009 | Ohba et al. |
| 2009/0236581 | A1* | 9/2009 | Yoshida et al. .................. 257/2 |

FOREIGN PATENT DOCUMENTS

| JP | 2006-173267 | 6/2006 |
| JP | 2007-189087 | 7/2007 |
| JP | 2009-043758 | 2/2009 |
| JP | 2009-129992 | 6/2009 |
| WO | WO 2008/068800 | 6/2008 |

* cited by examiner

*Primary Examiner* — Jami M Valentine
(74) *Attorney, Agent, or Firm* — Robert J. Depke; The Chicago Technology Law Group LLC

(57) ABSTRACT

Disclosed herein is a semiconductor memory device, including: a first electrode formed on a substrate; an ion source layer formed on an upper layer of the first electrode; and a second electrode formed on an upper layer of the ion source layer. Resistance change type memory cells in each of which either a surface of the first electrode or a surface of the ion source layer is oxidized to form a resistance change type memory layer in an interface between the first electrode and the ion source interface are arranged in a array.

5 Claims, 15 Drawing Sheets

F I G . 9
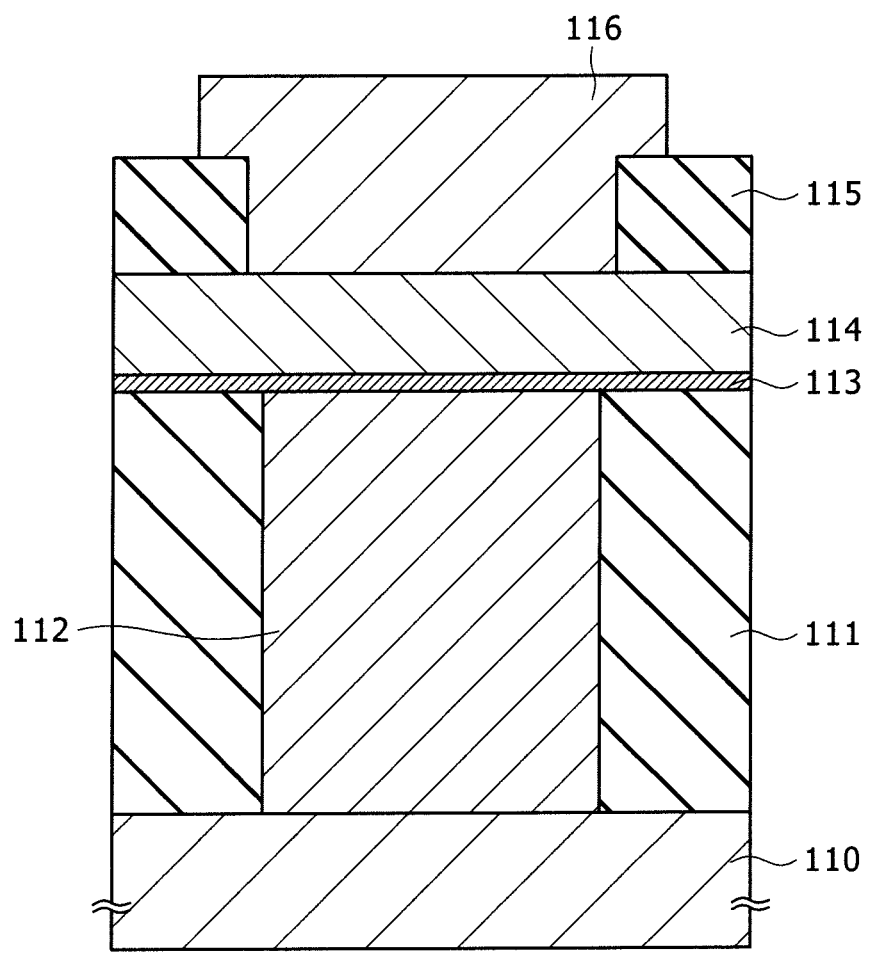

METHOD OF MANUFACTURING A SEMICONDUCTOR MEMORY DEVICE HAVING A RESISTANCE CHANGE MEMORY LAYER

CROSS REFERENCES TO RELATED APPLICATIONS

The subject matter of application Ser. No. 12/819,874 is incorporated herein by reference. The present application is a Divisional of U.S. Ser. No. 12/819,874, filed Jun. 21, 2010, which claims priority to Japanese Patent Application No. JP 2009-182036 filed in the Japanese Patent Office on Aug. 5, 2009, the entire content of which is hereby incorporated by reference.

BACKGROUND OF THE INVENTION

1. Field of the Invention

The present invention relates to a semiconductor memory device and a method of manufacturing the same, and more particularly to a resistance change type semiconductor memory device and a method of manufacturing the same.

2. Description of the Related Art

Semiconductor memory devices having various kinds of structures such as a Dynamic Random Access Memory (DRAM) and a Static Random Access Memory (SRAM) are known as semiconductor memory devices. In addition, semiconductor memory devices having various kinds of structures are known as non-volatile semiconductor memory devices as well.

A resistance change type semiconductor memory device as one of the non-volatile semiconductor memory devices is described in a Non-Patent Document 1 of K. Aratani et al., Proceeding of 2007 IEEE International Electron Devices Meeting pp. 787 to 786 (2007). In addition, the resistance change type semiconductor memory device having the same structure as that of the resistance change type semiconductor memory device described in a Non-Patent Document 1 is described in Japanese Patent Laid-Open No. 2006-173267 (referred to as Patent Document 1) as well.

FIG. 9 is a schematic cross sectional view showing a structure of a resistance change type semiconductor memory device according to the related art.

In a semiconductor substrate 110, an active region is divided into parts by an isolation insulating film (not shown). Also, a Metal-Oxide-Semiconductor (MOS) transistor is formed in a region (not shown).

Referring to FIG. 9, a first insulating film 111 is formed on the semiconductor substrate 110, and a region of the first insulating film 111 connected to the semiconductor substrate 110 or the like is opened. Also, a plug-like first electrode 112, for example, made of W or the like is filled in the region having the opening portion formed therein. The plug-like first electrode 112 is formed so as to be connected to a source/drain region of the MOS transistor described above, and has a function as a lower layer wiring.

A resistance change type memory layer 113 is formed on the first electrode 112 as an upper layer, and an ion source layer 114 is formed as an upper layer on the resistance change type memory layer 113.

For example, a third insulating film 115 is formed on the ion source layer 114, an opening portion is formed in the third insulating film 115 so as to reach the ion source layer 114, and a second electrode 116 is filled in the opening portion of the third insulating film 115.

For example, the ion source layer 114 contains therein both an element selected from the group including Cu, Ag and Zn, and an element selected from the group including Te, S and Se.

In addition, the memory layer 113 is made of either any one of a tantalum oxide, a niobium oxide, an aluminum oxide, a hafnium oxide, and a zirconium oxide, or a mixed material thereof.

For manufacturing the semiconductor memory device having the structure described above, for example, the first insulating film 111 is formed on the semiconductor substrate 110 having the isolation insulating film formed therein. The opening portion is formed in the first insulating film 111 so as to open a portion which is intended to be connected to the source/drain region of the MOS transistor, and the plug-like first electrode 112 is filled in the portion having the opening portion formed therein to be formed in the opening portion.

The resistance change type memory layer 113 is formed as the upper layer on the plug-like first electrode 112 by, for example, utilizing a physical vapor deposition method, a chemical vapor deposition, or the like, and the ion source layer 114 is formed as the upper layer on the memory layer 113.

For example, the third insulating film 115 is formed on the ion source layer 114, the opening portion is formed in the third insulating film 115 so as to reach the ion source layer 114, and the second electrode 116 is formed within the opening portion.

In the manufacturing method described above, the memory layer 113 made of a thin film is formed on the first electrode 112 composed of the W plug and the like. Here, a surface of the first electrode 112 composed of the W plug and the like is not flat, and a stepped portion exists between a peripheral insulating film and the first electrode 112. For this reason, it is difficult to thin the memory layer while the step coverage property is ensured. Thus, with regard to the element resistance and the memory characteristics, the thinning of the memory layer causes the dispersion among the elements.

On the other hand, it is previously found out that when the memory layer 113 is thickened in order to increase a film quality, a voltage necessary in a phase of recording is increased. Thus, a low voltage operation of the memory becomes difficult to carry out, and thus the thickening of the memory layer 113 causes an increase in chip size.

SUMMARY OF THE INVENTION

A problem to be solved by the present invention is that it is difficult to cause the thinning of the memory layer, and the suppression of the dispersion in electrical characteristics among the elements to be compatible with each other in the resistance change type semiconductor memory device.

The present invention has been made in order to solve the problem described above, and it is therefore desirable to provide a semiconductor memory device in which thinning of a memory layer, and suppression of a dispersion in electrical characteristics among elements can be caused to be compatible with each other, and a method of manufacturing the same.

In order to attain the desire described above, according to an embodiment of the present invention, there is provided a semiconductor memory device including: a first electrode formed on a substrate; an ion source layer formed on an upper layer of the first electrode; and a second electrode formed on an upper layer of the ion source layer; in which resistance change type memory cells in each of which either a surface of the first electrode or a surface of the ion source layer is oxidized to form a resistance change type memory layer in an interface between the first electrode and the ion source interface are arranged in a array.

The semiconductor memory device according to the embodiment of the present invention is structured by arranging the resistance change type memory cells in the array.

The resistance change type memory cell described above includes the first electrode formed on the substrate, the ion source layer formed on the upper layer of the first electrode, and the second electrode formed on the upper layer of the ion source layer. Also, either the surface of the first electrode or the surface of the ion source layer is oxidized to form the resistance change type memory layer in the interface between the first electrode and the ion source layer, thereby structuring the resistance change type memory cell.

According to another embodiment of the present invention, there is provided a method of manufacturing a semiconductor memory device including the steps of: forming a first electrode on a substrate; forming an ion source layer on an upper layer of the first electrode; and forming a second electrode on an upper layer of the ion source layer; and further having the step of oxidizing either a surface of the first electrode or a surface of the ion source layer to form a resistance change type memory layer in an interface between the first electrode and the ion source layer between the step of forming the first electrode on the substrate and the step of forming the second electrode on the upper layer of the ion source layer; in which the resistance change type memory cells are arranged in an array, thereby structuring the semiconductor memory device.

The method of manufacturing the semiconductor memory device according to the another embodiment of the present invention is a method of manufacturing a semiconductor memory device in which the resistance change type memory cells are arranged in the array, thereby structuring the semiconductor memory device.

The first electrode is formed on the substrate, the ion source layer is formed on the upper layer of the first electrode, and the second electrode is formed on the upper layer of the ion source layer. Here, the method of manufacturing the semiconductor memory device according to the another embodiment of the present invention further includes the step of oxidizing either the surface of the first electrode or the surface of the ion source layer to form the resistance change type memory layer in the interface between the first electrode and the ion source layer between the step of forming the first electrode on the substrate and the step of forming the second electrode on the upper layer of the ion source layer.

According to the semiconductor memory device of the present invention, the thinning of the memory layer, and the suppression of the dispersion in electrical characteristics among the elements can be caused to be compatible with each other in the resistance change type semiconductor memory device.

According to the method of manufacturing the semiconductor memory device of the present invention, it is possible to manufacture the semiconductor memory device in which the thinning of the memory layer, and the suppression of the dispersion in electrical characteristics among the elements can be caused to be compatible with each other in the resistance change type semiconductor memory device.

BRIEF DESCRIPTION OF THE DRAWINGS

FIG. 9 is a schematic cross sectional view showing a structure of a memory cell of a semiconductor memory device according to the related art.

DETAILED DESCRIPTION OF THE PREFERRED EMBODIMENTS

The preferred embodiments of the present invention will be described in detail hereinafter with reference to the accompanying drawings.

It is noted that the description will be given below in accordance with the following order.

1. Semiconductor memory device of first embodiment
2. Method of manufacturing memory element of semiconductor memory device of first embodiment (a method of oxidizing a surface of a first electrode to form a memory layer)
3. Semiconductor memory device of second embodiment
4. Method of manufacturing memory element of semiconductor memory device of second embodiment (a method of oxidizing a surface of a first electrode to form a memory layer)
5. Semiconductor memory device of third embodiment
6. Method of manufacturing memory element of semiconductor memory device of third embodiment (a method of oxidizing a surface of an ion source layer to form a memory layer)
7. Example 1 of third embodiment 1. Semiconductor Memory Device of First Embodiment
[Structure of Memory Element of Semiconductor Memory Device]

A semiconductor memory device according to a first embodiment of the present invention is structured by arranging resistance change type memory cells in an array.

Hereinafter, a memory element composing each of the resistance change type memory cells will be described in detail.

Figure 1:
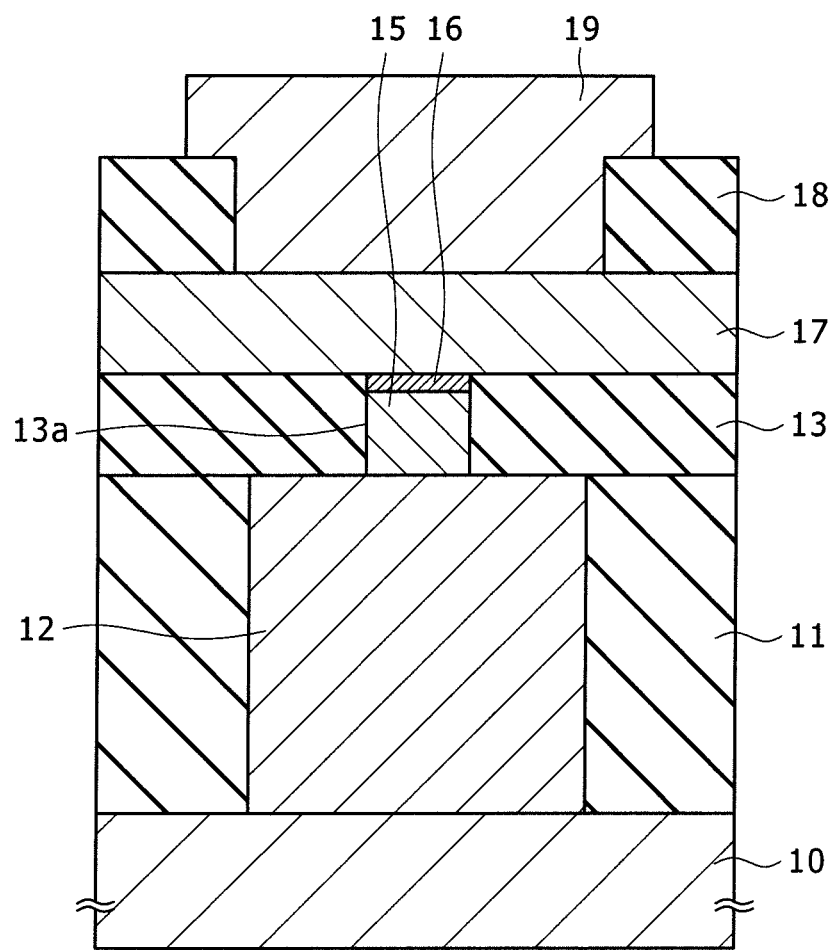
FIG. 1 is a schematic cross sectional view showing a structure of a memory cell of a semiconductor memory device according to a first embodiment of the present invention.

FIG. 1 is a schematic cross sectional view showing a structure of the memory element of the semiconductor memory device according to the first embodiment of the present invention.

For example, a semiconductor substrate 10 is divided into parts by an isolation insulating film (not shown), and an electronic element such as a Metal-Oxide-Semiconductor (MOS) transistor is formed in an active region (not shown).

Referring to FIG. 1, for example, a first insulating film 11 is formed on the semiconductor substrate 10, a region which is connected to the semiconductor substrate 10 is opened, and a lower layer wiring 12, for example, made of a W plug or the like is filled in the opening portion. The lower layer wiring 12 is formed so as to be connected to a source/drain region of the MOS transistor described above.

In addition, for example, a second insulating film 13 which is made of a silicon oxide, a silicon nitride or the like, and which has a thickness of about 50 to 300 nm is formed on an upper layer of the lower layer wiring 12. Also, an opening portion 13a is formed in the second insulating film 13 so as to open a portion which is connected to the lower layer wiring 12.

A first electrode 15 is filled in the opening portion 13a.

The first electrode 15, for example, is made of a conductive material which is selected from the group including Ni, Fe, Ti, TiN, Ta, TaN, W, WN, Hf, Al, Mg, and Gd. Or, the first electrode 15 may be formed from a lamination conductive layer including both a conductive layer a material for which is selected from the group including Ni, Fe, Ti, TiN, Ta, TaN, W, WN, and the like, and a conductive layer a material for which is selected from the group including Hf, Al, Mg, Gd, and the like.

For example, a resistance change type memory layer 16 is formed on a surface of the first electrode 15.

The resistance change type memory layer 16 is a layer which is obtained by oxidizing a surface of the first electrode 15, that is, is made of an oxide of an element composing the first electrode 15. For example, when the first electrode 15 contains therein either Ta or Al, the resistance change type memory layer 16 is made of a tantalum oxide or an aluminum oxide, or a mixed material thereof.

For example, the resistance change type memory layer 16 preferably contains therein Al, Mg or a rare earth element.

For example, an ion source layer 17 is formed on an upper layer of the resistance change type memory layer 16.

The ion source layer 17, for example, contains therein an element which is selected from the group including Cu, Ag and Zn, and an element which is selected from the group including Te, S and Se.

For example, the ion source layer 17 preferably contains therein at least one kind of chalcogen element of Te, S and Se. In addition, the ion source layer 17 preferably contains therein at least one kind of element of Cu, Ag and Zn.

For example, a third insulating film 18 is formed on the ion source layer 17, an opening portion is formed so as to reach the ion source layer 17, and a second electrode 19 is formed so as to be filled in the opening portion.

The resistance change type memory layer 16 is a layer which is formed by oxidizing a surface of the first electrode 15 in an interface between the first electrode 15 and the ion source layer 17.

Since the resistance change type memory layer 16 is the layer which is formed by oxidizing the surface of the first electrode 15, the thinning of the resistance change type memory layer 16 can be realized while a high step coverage property and a uniform thickness of the resistance change type memory layer 16 are ensured.

In the memory element of the semiconductor memory device of the first embodiment, the thinning of the memory layer, and the suppression of the dispersion in electrical characteristics among the elements can be caused to be compatible with each other in the manner described above.

2. Method of Manufacturing Memory Element of Semiconductor Memory Device of First Embodiment (a Method of Oxidizing a Surface of a First Electrode to Form a Memory Layer)

Next, a method of manufacturing the resistance change type memory element of the semiconductor memory device according to the first embodiment of the present invention will be described in detail with reference to FIGS. 2A to 2H.

For example, the isolation insulating film (not shown) is formed in the semiconductor substrate 10 to divide the active region (not shown) into the parts, and the electronic element such as the MOS transistor is formed in the active region not shown.

Figure 2A:
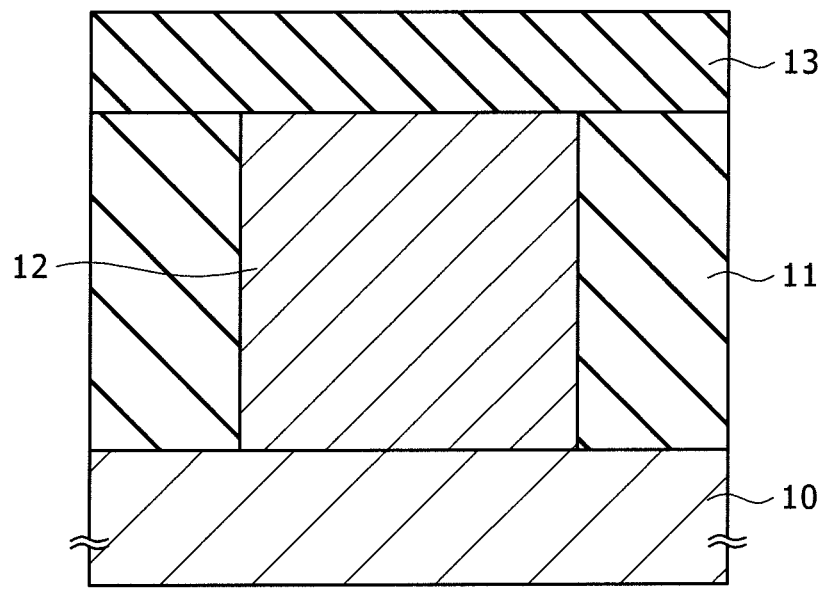
FIGS. 2A to 2H are respectively schematic cross sectional views explaining respective processes for manufacturing the memory cell of the semiconductor memory device according to the first embodiment of the present invention.

Next, as shown in FIG. 2A, the first insulating film 11 is formed on the semiconductor substrate 10, and the opening portion is formed in the first insulating film 11 so as to reach the semiconductor substrate 10.

Next, the opening portion is filled by, for example, utilizing an RF sputtering method to deposit a conductive material such as W. Also, the conductive material deposited on the outside of the opening portion, thereby forming the lower layer wiring 12 composed of the W plug and the like.

The lower layer wiring 12, for example, is formed so as to be connected to the source/drain region of the MOS transistor described above.

Next, for example, either a silicon oxide or a silicon nitride is deposited on the upper layer of the lower layer wiring 12 to have a thickness of about 50 to about 300 nm by utilizing a plasma Chemical Vapor Deposition (CVD) method, a spin coat method or the like, thereby forming the second insulating film 13.

Figure 2B:
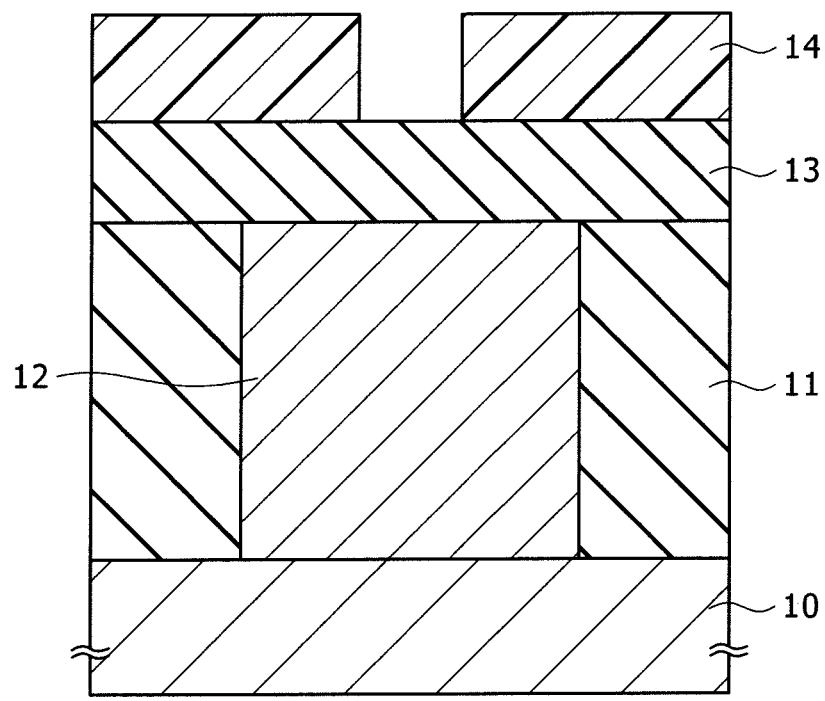

Next, as shown in FIG. 2B, for example, a photo resist is deposited on the second insulating film 13 by, for example, utilizing the spin coat method or the like, or a dry film or the like is stuck to the second insulating film 13. Next, the photo resist is patterned so as to open a portion which is intended to be connected to the lower layer wiring 12 in a photolithography process, thereby forming a resist mask 14.

KrF exposure equipment, ArF exposure equipment, immersion ArF exposure equipment or the like, for example, can be used for the patterning of formation of the resist mask.

Figure 2C:
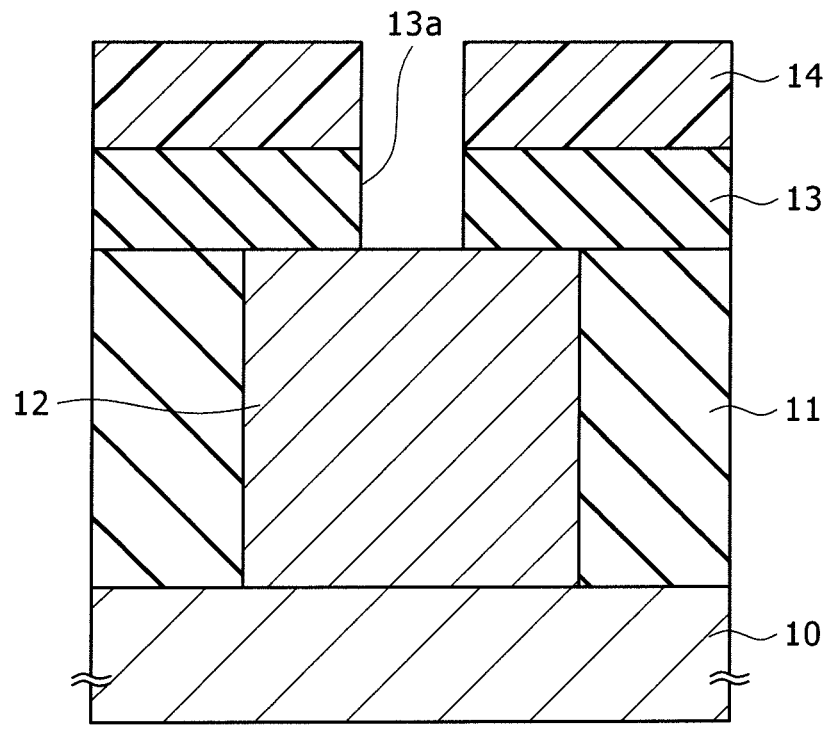

Next, as shown in FIG. 2C, for example, etching processing such as dry etching processing is carried out for the second insulating film 13 with the resist mask 14 as an etching mask, thereby forming the opening portion 13a in the second insulating film 13 so as to reach the lower layer wiring 12.

For the dry etching processing described above, for example, a $C_xF_y$ (x=1 to 6, y=1 to 8) gas, an $O_2$ gas or a rare gas is used as an etching gas. In addition, a magnetron etching system, for example, is used as an etching system.

Figure 2D:
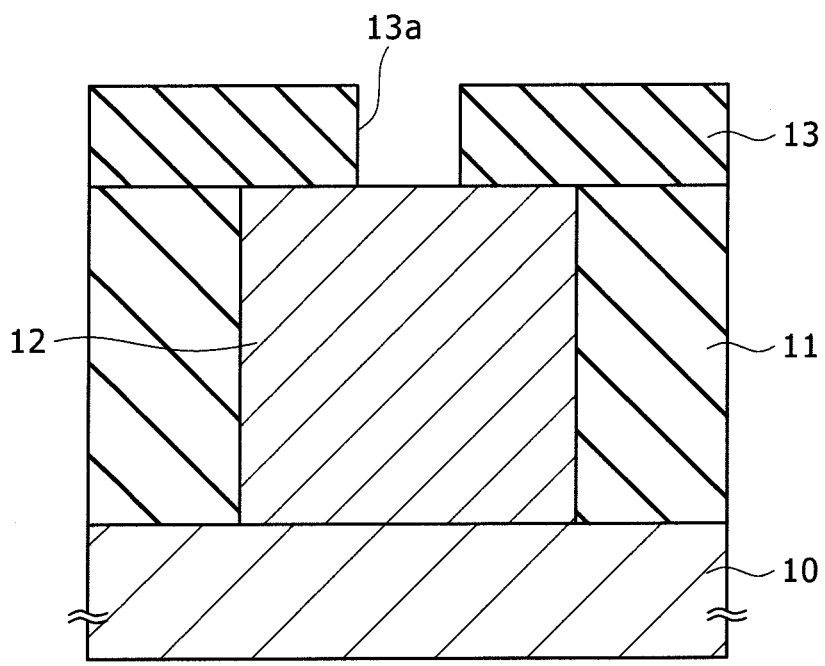

Next, as shown in FIG. 2D, for example, ashing processing with oxygen plasma as a base, and organic amine system chemical processing are carried out, thereby completely removing away the resist mask 14, and a residual matter generated in the ashing processing.

Figure 2E:
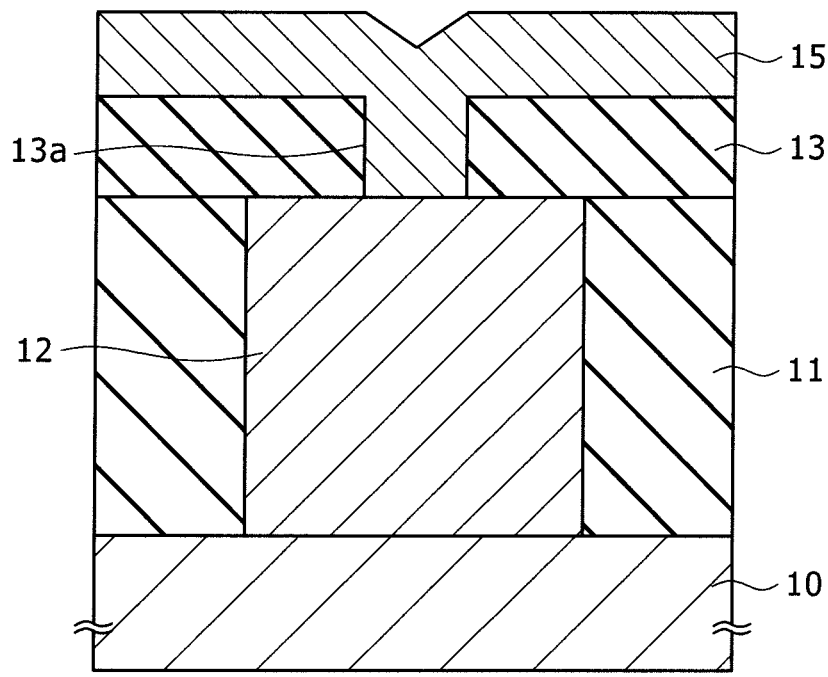

Next, as shown in FIG. 2E, a conductive material is deposited so as to be filled in the opening portion 13a by, for example, utilizing an RF sputtering method or the like, thereby forming the first electrode 15.

The first electrode 15, for example, is made of a conductive material which is selected from the group including Ni, Fe, Ti, TiN, Ta, TaN, W, WN, Hf, Al, Mg, and Gd. Or, the first electrode 15 may be formed from the lamination conductive layer including both the conductive layer a material for which is selected from the group including Ni, Fe, Ti, TiN, Ta, TaN, W, WN, and the like, and the conductive layer a material for which is selected from the group including Hf, Al, Mg, Gd, and the like.

Figure 2F:
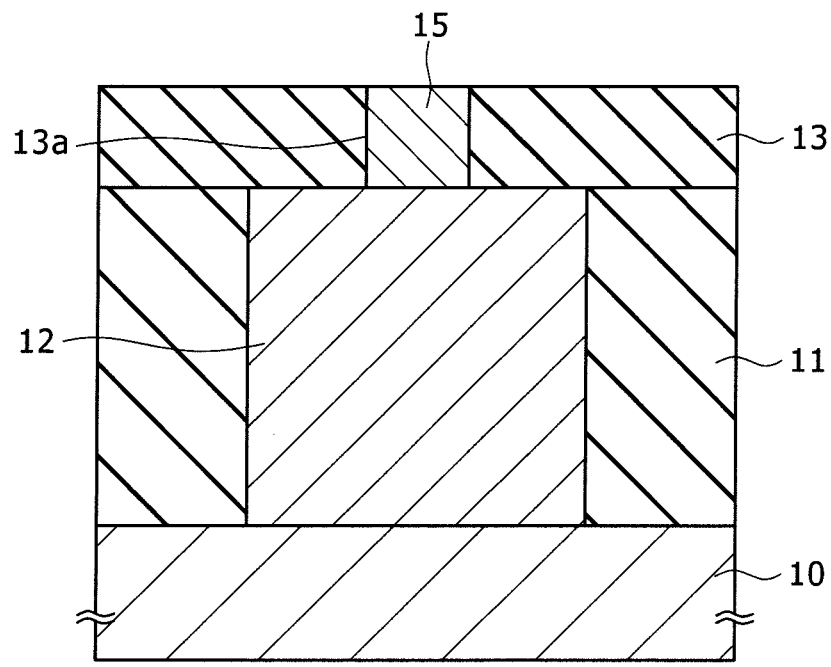

Next, as shown in FIG. 2F, the conductive material composing the first electrode 15 lying outside the opening portion 13*a* is removed away by, for example, utilizing a Chemical Mechanical Polishing (CMP) method or the like, thereby obtaining the plug-like first electrode 15 filled in the opening portion 13*a*.

Figure 2G:
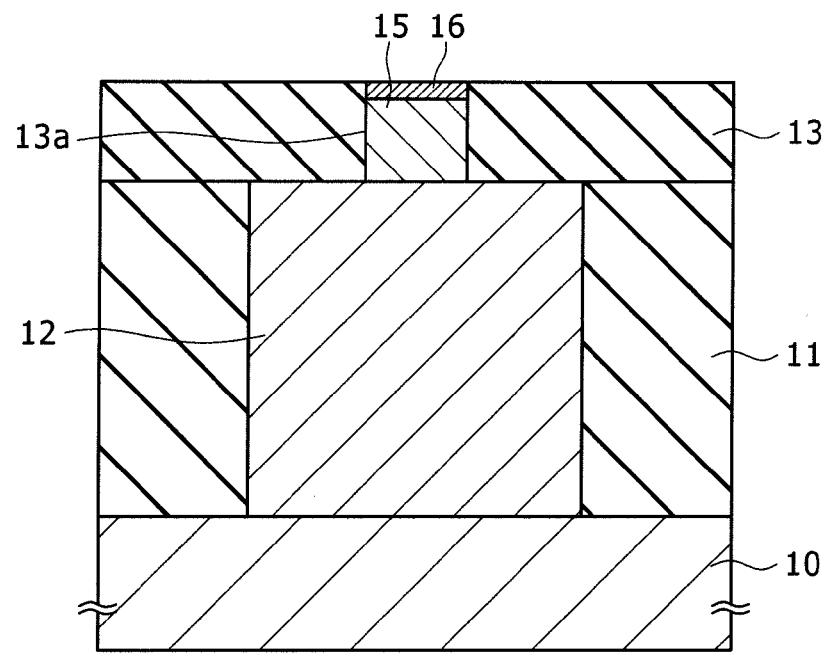

Next, as shown in FIG. 2G, for example, the surface of the first electrode 15 is oxidized, thereby forming the resistance change type memory layer 16 on the surface of the first electrode 15. Any of thermal oxidation, plasma oxidation, natural oxidation, and the like may be adopted as the oxidation method in this case.

For example, in the case of adopting the thermal oxidation, an annealing treatment is carried out at a wafer heating temperature of 100 to 350° C. under an atmosphere containing therein oxygen. Any of a furnace annealing treatment and a Rapid Thermal Annealing (RTA) treatment may be adopted as the annealing treatment.

By carrying out the oxidation treatment described above, when a single metal is used as the electrode material, an oxide film of the single metal is formed on the surface of the first electrode 15. On the other hand, when two or more kinds of metals are used as the electrode material, an oxide of the metal which is easier to further oxidize than any of other metals is formed on the surface of the first electrode 15.

For example, Mg, Al, Ti or the like is an element which is relatively, more readily oxidized than Ci, Ni, Fe or the like. Thus, when the first electrode 15 contains therein Mg, Al or Ti, a magnesium oxide, an aluminum oxide or a titanium oxide is formed as the resistance change type memory layer 16 on the surface of the first electrode 15.

In addition, oxides containing therein a plurality of metallic elements are formed as the resistance change type memory layer 16 on the surface of the first electrode 15 in some cases depending on the elements contained in the first electrode 15.

For example, the film containing therein Al, Mg or a rare earth element is preferably formed as the resistance change type memory layer 16.

Figure 2H:
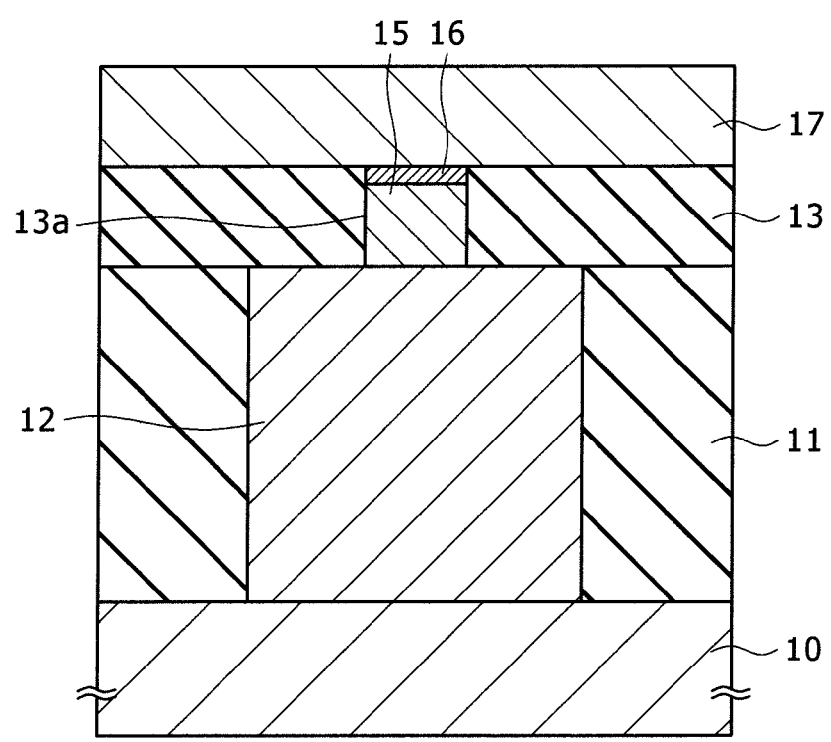

Next, as shown in FIG. 2H, the ion source layer 17 is formed on an upper layer of the first electrode 15 to have the thickness of about 10 to about 100 nm by, for example, utilizing the RF sputtering method.

For example, the ion source layer 17 preferably contains therein at least one kind of chalcogen element of Te, S and Se. In addition, a film containing therein at least one kind of element of Cu, Ag and Zn is preferably formed as the ion source layer 17.

Next, for example, the third insulating film 18 is formed on the ion source layer 17, the opening portion is formed in the third insulating film 18 so as to reach the ion source layer 17, and the opening portion is filled, thereby forming the second electrode 19.

The memory element of the semiconductor memory device having the structure shown in FIG. 1 can be manufactured in the manner as described above.

According to the method of manufacturing the resistance change type memory element of the semiconductor memory device of the first embodiment, the resistance change type memory layer 16 of the memory element is formed by oxidizing the surface of the first electrode 15 in the interface between the first electrode 15 and the ion source layer 17.

Since the resistance change type memory layer 16 is the layer which is formed by oxidizing the surface of the first electrode 15, the thinning of the resistance change type memory layer 16 can be realized while the high step coverage property and the uniform thickness of the resistance change type memory layer 16 are ensured.

In the resistance change type memory element manufactured by using the method of manufacturing the semiconductor memory device of the first embodiment, the thinning of the resistance change type memory layer, and the suppression of the dispersion in electrical characteristics among the elements can be caused to be compatible with each other in the manner described above.

[Entire Configuration of Semiconductor Memory Device]

Figure 3A:
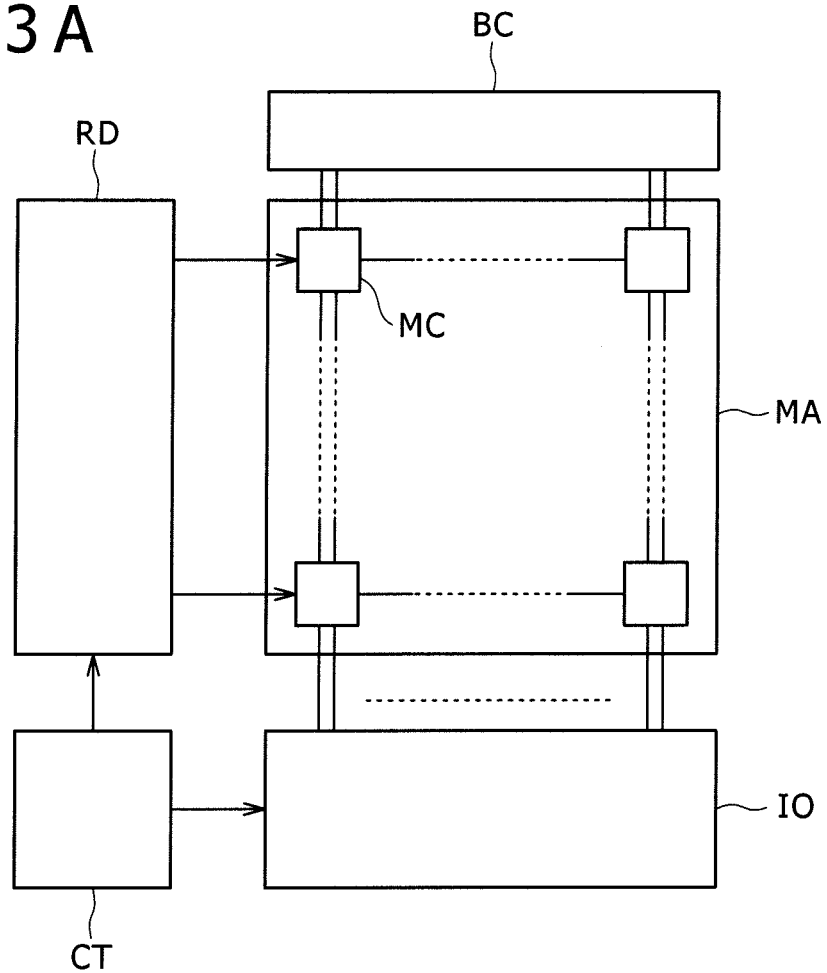
FIGS. 3A and 3B are respectively a block diagram showing an entire configuration of the semiconductor memory device according to the first embodiment of the present invention, and an equivalent circuit diagram of the memory cell included in the semiconductor memory device according to the first embodiment of the present invention.
Figure 3B:
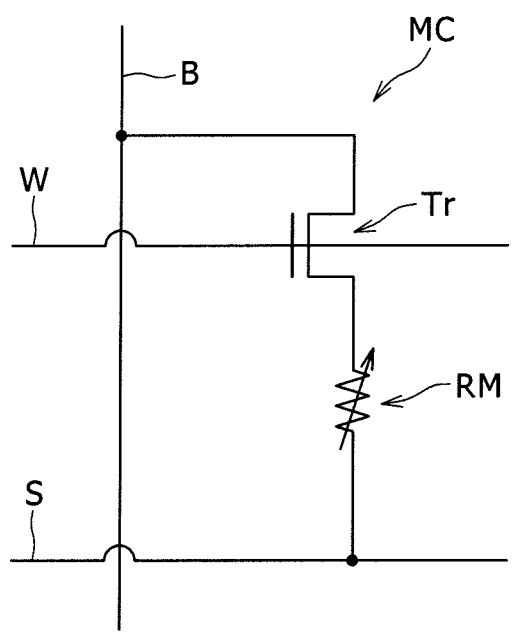

FIGS. 3A and 3B are respectively a block diagram showing an entire configuration of the semiconductor memory device according to the first embodiment of the present invention, and an equivalent circuit diagram of the memory cell included in the semiconductor memory device according to the first embodiment of the present invention.

The semiconductor memory device of the first embodiment shown in FIG. 3A, for example, includes a control portion CT, a row decode portion RD, a data input/output portion 10, a bit line control portion BC, and a memory cell array MA. In addition, the memory cell array MA includes a plurality of memory cells MC arranged in an array.

The control portion CT, for example, outputs various kinds of control signals in accordance with which an operation for reading out or writing data selected is carried out to the row decode portion RD, the data input/output portion 10, and the bit line control portion BC. Thus, the control portion CT controls an operation for writing or reading out the data to or from the memory cell array MA.

The row decode portion RD decodes address data in accordance with the control signal supplied thereto from the control portion CT in a phase of read or write of the data to select any one of word lines connected to the memory cells MC in the memory cell array MA, thereby activating the word line thus selected.

The data input/output portion 10 decodes the address data in accordance with the control signal supplied thereto from the control portion CT in the phase of read or write of the data to select one block from bit lines connected to the memory cells MC in the memory cell array MA.

In the phase of the read of the data, signals which are outputted from the memory cells to the bit lines, respectively, are amplified by internal differential amplifying circuits, and the signals thus amplified supplied from the memory cells connected to the bit line pair selected are outputted to the data lines, respectively.

In addition, in the phase of write of the data, the signals from the data lines are amplified by amplifying circuits for write, and the signals thus amplified are outputted to the memory cells connected to the bit lines selected, respectively.

The bit line control portion BC controls bit line voltages in accordance with the control signals supplied from the control portion CT.

The memory cell array MA includes a plurality of memory cells MC arranged in the array.

Word lines corresponding to the rows, respectively, are connected to the memory cells belonging to the rows in the matrix, respectively, and bit lines corresponding to the columns, respectively, are connected to the memory cells belonging to the columns in the matrix, respectively.

FIG. 3B is an equivalent diagram of each of the memory cells described above.

One terminal of a resistance change type memory element RM is connected to one source/drain terminal of a transistor Tr having a gate terminal connected to a word line W. For example, the transistor Tr is structured in the form of a MOS transistor or the like formed on the semiconductor substrate, and the resistance change type memory element RM has the structure described above.

The other source/drain terminal of the MOS transistor Tr is connected to a bit line B, and a signal line S is connected to the other terminal of the resistance change type memory element RM.

The semiconductor memory device having the structure described above can be operated in the same manner as that described in Patent Document 1.

A suitable voltage is applied across the second electrode 19 and the first electrode 15 to form a current path containing therein one or more kinds of metallic elements within the resistance change type layer 16, or to form a large number of defects within the resistance change type layer 16, thereby reducing a resistance value of the resistance change type layer 16. Thus, the resistance value corresponding to information such as "0" or "1" is held in corresponding one of the memory cells MC in accordance with a change in resistance value of the resistance change type layer 16, thereby storing the information such as "0" or "1" in the corresponding one of the memory cells MC.

For example, when a positive potential is applied either to the ion source layer 17 itself containing therein Cu, Ag, Zn or the like, or to a side of one electrode, i.e., the second electrode 19 contacting the ion source layer 17, thereby applying a voltage across the resistance change type memory element RM, Cu, Ag, Zn (ion source element) or the like contained in the ion source layer 17 is ionized to diffuse into the resistance change type memory layer 16. At this time, such an ion source element is bonded to the electrons in a portion on the side of the other electrode, i.e., the first electrode 15 to be precipitated, or stays within the resistance change type memory layer 16 to form impurity levels of the insulating film, thereby reducing the resistance value of the resistance change type memory layer 16. As a result, the information can be recorded.

In addition, when from this state, a negative potential is applied either to the ion source layer 17 containing therein Cu, Ag, Zn or the like, or to the side of one electrode, i.e., the second electrode 19 contacting the ion source layer 17, thereby applying a negative voltage across the resistance change type memory element RM, Cu, Ag, Zn or the like which is precipitated on the side of the other electrode, i.e., the first electrode 15 of the resistance change type memory element RM is ionized again. Thus, Cu, Ag, Zn or the like thus ionized returns back to one electrode side of the resistance change type memory element RM, whereby the low resistance value of the resistance change type memory layer 16 returns back to the essential high resistance value, thereby increasing the resistance value of the resistance change type memory element RM. As a result, it is possible to erase the information recorded in the resistance change type memory element RM.

Any element (chalcogenide element) which is selected from the group including Te, S and Se is contained in the ion source layer 17, thereby promoting the ionization of Cu, Ag or Zn.

Also, the resistance change type memory layer 16 is made of any one of a tantalum oxide, a niobium oxide, an aluminum oxide, a hafnium oxide, and a zirconium oxide, or a mixed material thereof, and a melting point of each of these oxides is high. Therefore, a microstructure of the resistance change type memory layer 16 can be stabilized against a rise in temperature.

As a result, since thermal resistance of the resistance change type memory layer 16 can be enhanced, the manufacture yield of the resistance change type memory elements RM under the high temperature process can be enhanced. In addition, the stability against the local temperature rise in the phase of the operation such as the recording/erasing operation is improved, and thus, for example, the number of times of the repetitive rewritable operation can be increased. Moreover, even in a phase of long term data preservation under the high temperature environment or the like, the high resistance state can be stably maintained.

In addition, since the resistance change type memory layer 16 made of any one of these oxides has a sufficient dielectric withstand voltage even when the thickness thereof is reduced, the high resistance state can be readily realized. Also, since the number of defects such as a pin hole can be reduced, the information can be stably recorded.

In the resistance change type memory element RM and the semiconductor memory device of the present invention described above, it is also adopted such a structure that the ion source layer 17 contains therein CuTe.

When such a structure is adopted, since the electrical conductivity is higher in Te than in any of other chalcogen elements and Cu also has the high electrical conductivity, the resistance value of the ion source layer 17 becomes low, and thus a difference in resistance value between the resistance change type memory layer 16 and the ion source layer 17 becomes large. For this reason, the resistance change of the resistance change type memory layer 16 caused by the recording/erasing of the information mainly depends on the resistance change of the resistance change type memory layer 16 having the large resistance value.

As a result, even if the ion source layer 17 containing therein CuTe is changed in resistance value thereof by the temperature rise, the change of the resistance value of the ion source layer 17 hardly exerts an influence on the change of the resistance value of the resistance change type memory element RM, and thus does not exert a large influence on the memory operation.

Therefore, in the phase of the manufacture, in the phase of the use, and in the phase of the preservation under the high temperature environment, it is possible to further suppress the deterioration of the characteristics of the resistance change type memory element RM.

The semiconductor memory device of the first embodiment is the resistance change type semiconductor memory device having the structure that the first electrodes 15, and the resistance change type memory layer 16 are continuously connected to each other. Also, with regard to the method of manufacturing the same, the resistance change type memory layer 16 is formed by oxidizing one of the metals contained therein the first electrode 15.

With regard to the method of oxidation, for example, the material containing therein either a single metallic element or a plurality of metallic element is used for the first electrode 15. After that, the surface oxidation is carried out, thereby forming seamlessly, and continuously the resistance change type memory layer 16 and the first electrode 15. In this case, since the resistance change type memory layer 16 is formed from the element(s) contained in the first electrode 15 in a self-formation manner, the resistance change type memory layer 16 can be formed as the uniform thin film irrespective of the surface roughness of the first electrode 15, and the stepped portion between the peripheral insulating film and the first electrode 15.

3. Semiconductor Memory Device of Second Embodiment

[Structure of Memory Element of Semiconductor Memory Device]

A semiconductor memory device according to a second embodiment of the present invention is structured by arranging resistance change type memory cells in an array similarly to the case of the first embodiment.

Figure 4:
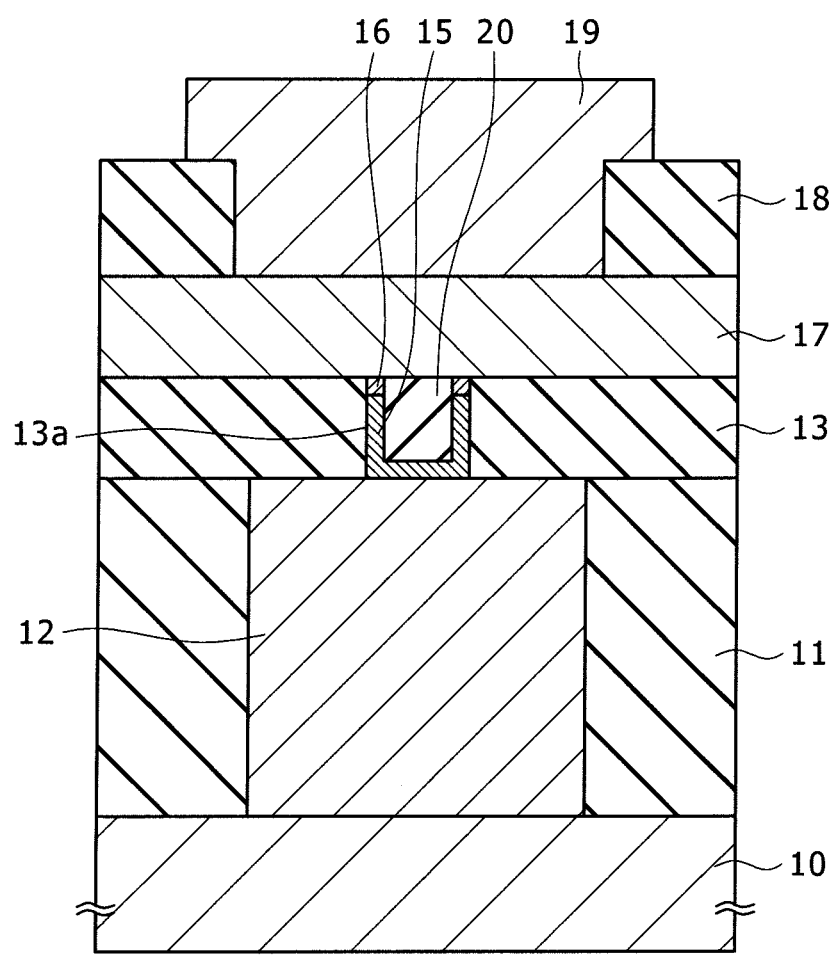
FIG. 4 is a schematic cross sectional view showing a structure of a memory cell of a semiconductor memory device according to a second embodiment of the present invention.

FIG. 4 is a schematic cross sectional view showing a structure of a memory element of the semiconductor memory device of the second embodiment.

The first electrode 15 is formed within the opening portion 13a of the second insulating film 13 so as to cover an inner wall of the opening portion 13a. Also, a filled insulating film 20 made of a silicon oxide, a silicon nitride or the like is formed in an inside region of the opening portion 13a. The memory element of the semiconductor memory device of the second embodiment has substantially the same structure as that of the memory element of the semiconductor memory device of the first embodiment except for the structure described above.

The resistance change type memory layer 16 is formed on the surface of the first electrode 15 similarly to the case of the first embodiment. The resistance change type memory layer 16 is a layer which is formed by oxidizing the surface of the first electrode 15, that is, is made of the oxide of the element (s) composing the first electrode 15.

The resistance change type memory layer 16 of the resistance change type memory element of the semiconductor memory device of the second embodiment is the layer which is formed by oxidizing the surface of the first electrode 15 in the interface between the first electrode 15 and the ion source layer 17.

Since the resistance change type memory layer 16 is the layer which is formed by oxidizing the surface of the first electrode 15, the thinning of the resistance change type memory layer 16 can be realized while the high step coverage property and the uniform thickness of the resistance change type memory layer 16 are ensured.

In the resistance change type memory element of the semiconductor memory device of the second embodiment, the thinning of the resistance change type memory layer 16, and the suppression of the dispersion in electrical characteristics among the elements can be caused to be compatible with each other in such a manner.

4. Method of Manufacturing Memory Element of Semiconductor Memory Device of Second Embodiment (a Method of Oxidizing a Surface of a First Electrode to Form a Memory Layer)

Next, a method of manufacturing the resistance change type memory element of the semiconductor memory device according to the second embodiment of the present invention will be described in detail with reference to FIGS. 5A to 5D.

The processes up to the process shown in FIG. 2D in the first embodiment are carried out similarly to those in the case of the first embodiment.

Figure 5A:
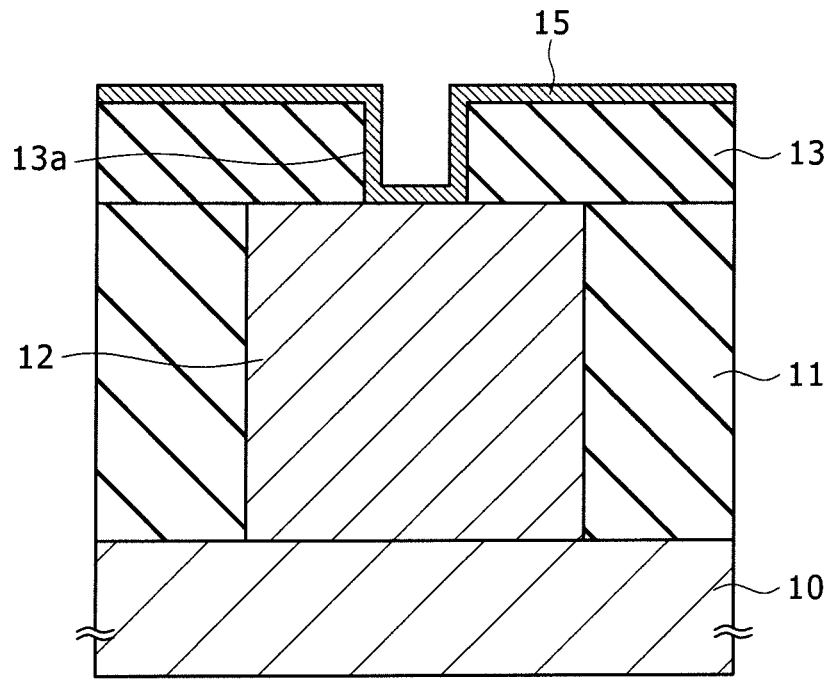
FIGS. 5A to 5D are respectively schematic cross sectional views explaining respective processes for manufacturing the memory cell of the semiconductor memory device according to the second embodiment of the present invention.

Next, as shown in FIG. 5A, the first electrode 15 is formed so as to cover the inner wall of the opening portion 13a by, for example, utilizing the RF sputtering method or the like. In this case, the first electrode 15 is deposited to have the thickness not enough to be filled in the opening portion 13a.

The first electrode 15, for example, is made of a conductive material which is selected from the group including Ni, Fe, Ti, TiN, Ta, TaN, W, WN, Hf, Al, Mg, and Gd. Or, the first electrode 15 may be formed from the lamination conductive layer including the conductive layer a material for which is selected from the group including Ni, Fe, Ti, TiN, Ta, TaN, W, WN, and the like, and the conductive layer a material for which is selected from the group including Hf, Al, Mg, Gd, and the like.

Figure 5B:
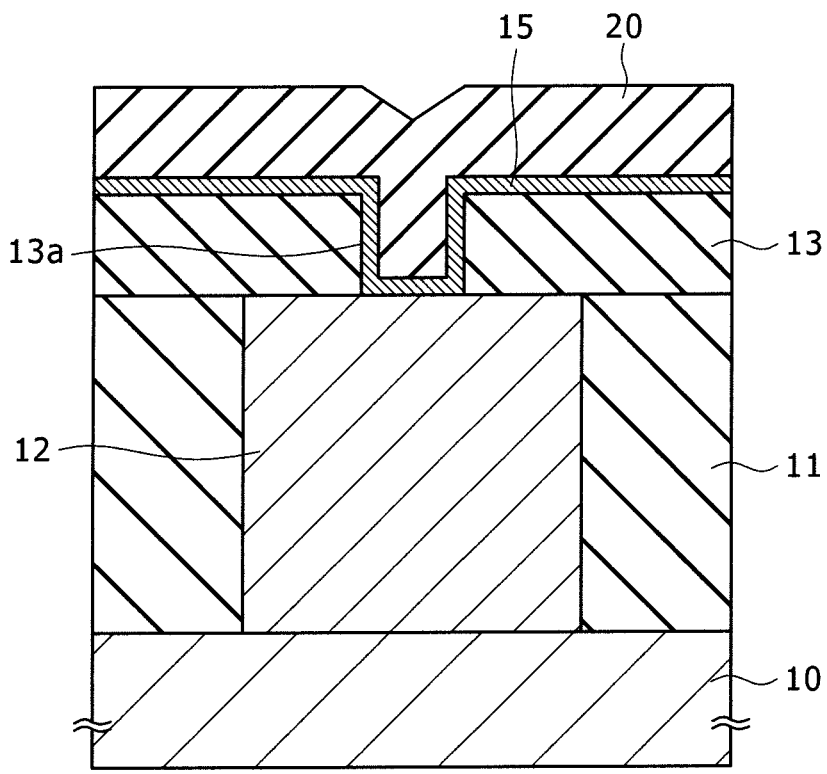

Next, as shown in FIG. 5B, either a silicon oxide or a silicon nitride is deposited on an upper layer of the first electrode 15 by, for example, utilizing the CVD method so as to be filled in the opening portion 13a, thereby forming the filled insulating film 20 as an upper layer of the first electrode 15.

Figure 5C:
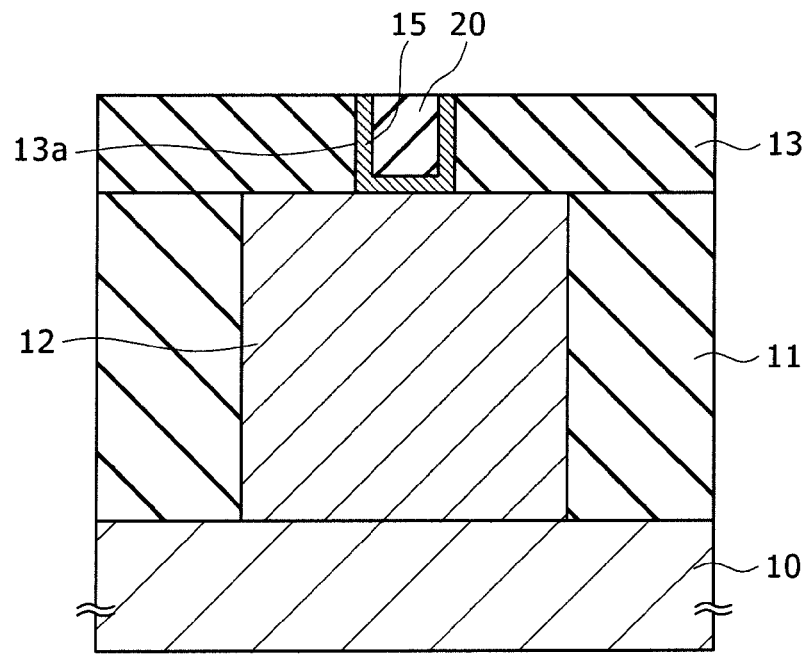

Next, as shown in FIG. 5C, a part of the conductive material composing the first electrode 15, and a part of the filled insulating film 20 which are deposited outside the opening portion 13a are removed away by, for example, utilizing the Chemical Mechanical Polishing (CMP) method or the like, thereby obtaining the first electrode 15 having the shape of being filled in the opening portion 13a. As a result, there is provided a state in which the ring-like surface of the first electrode 15 is exposed along the peripheral portion of the opening portion 13a.

Figure 5D:
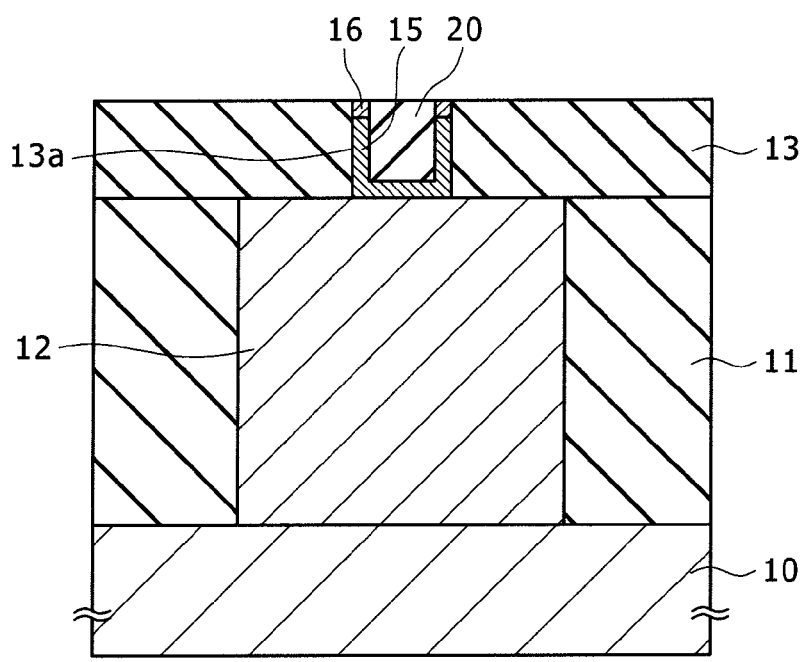

Next, as shown in FIG. 5D, similarly to the case of the first embodiment, for example, the surface of the first electrode 15 is oxidized, thereby forming the resistance change type memory layer 16 on the surface of the first electrode 15. Any of the thermal oxidation, the plasma oxidation, the natural oxidation, and the like may be adopted as the oxidation method in this case.

The subsequent processes are carried out similarly to the case of the first embodiment, thereby making it possible to manufacture the resistance change type memory element of the semiconductor memory device having the structure shown in FIG. 4.

According to a method of manufacturing the semiconductor memory device of the second embodiment, the resistance change type memory layer 16 of the memory element is formed by oxidizing the surface of the first electrode 15 in the interface between the first electrode 15 and the ion source layer 17.

Since the resistance change type memory layer 16 is the layer which is formed by oxidizing the surface of the first electrode 15, the thinning of the resistance change type memory layer 16 can be realized while the high step coverage property and the uniform thickness of the resistance change type memory layer 16 are ensured.

In the resistance change type memory element manufactured by using the method of manufacturing the semiconductor memory device of the second embodiment, the thinning of the resistance change type memory layer, and the suppression of the dispersion among the elements can be caused to be compatible with each other in the manner described above.

5. Semiconductor Memory Device of Third Embodiment

[Structure of Memory Element of Semiconductor Memory Device]

A semiconductor memory device according to a third embodiment of the present invention is structured by arranging resistance change type memory cells in an array similarly to the case of the first embodiment.

Figure 6:
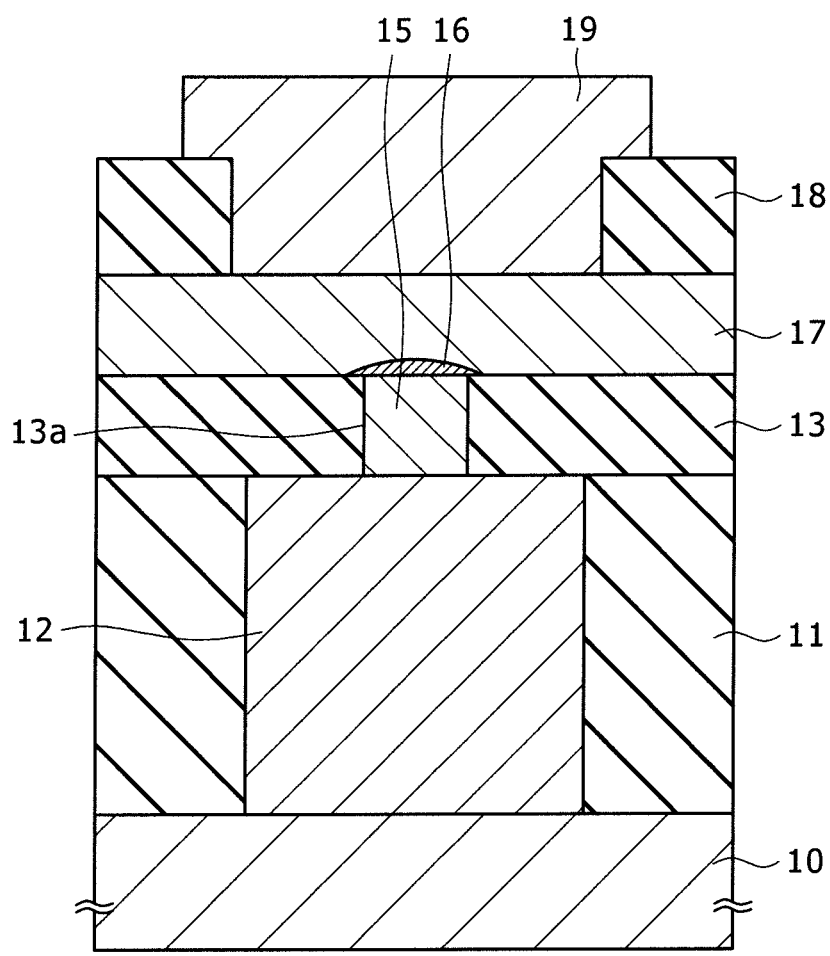
FIG. 6 is a schematic cross sectional view showing a structure of a memory cell of a semiconductor memory device according to a third embodiment of the present invention.

FIG. 6 is a schematic cross sectional view showing a structure of a memory element of the semiconductor memory device of the third embodiment.

Although the memory element of the semiconductor memory device of the third embodiment has substantially the same structure as that the memory element of the semiconductor memory device of the first embodiment, the third embodiment is different from the first embodiment in that the resistance change type memory layer 16 is a layer which is formed by oxidizing a surface of the ion source layer 17 in the interface between the first electrode 15 and the ion source layer 17.

Since the resistance change type memory layer 16 is the layer which is formed by oxidizing the surface of the ion source layer 17, the thinning of the resistance change type memory layer 16 can be realized while the high step coverage property and the uniform thickness of the resistance change type memory layer 16 are ensured.

In the resistance change type memory element of the semiconductor memory device of the third embodiment, the thinning of the resistance change type memory layer 16, and the suppression of the dispersion of the electrical characteristics among the elements can be caused to be compatible with each other in such a manner.

6. Method of Manufacturing Memory Element of Semiconductor Memory Device of Third Embodiment (a Method of Oxidizing a Surface of an Ion Source Layer to Form a Memory Layer)

Next, a method of manufacturing the resistance change type memory element of the semiconductor memory device according to the third embodiment of the present invention will be described in detail with reference to FIGS. 7A to 7F.

Figure 7A:
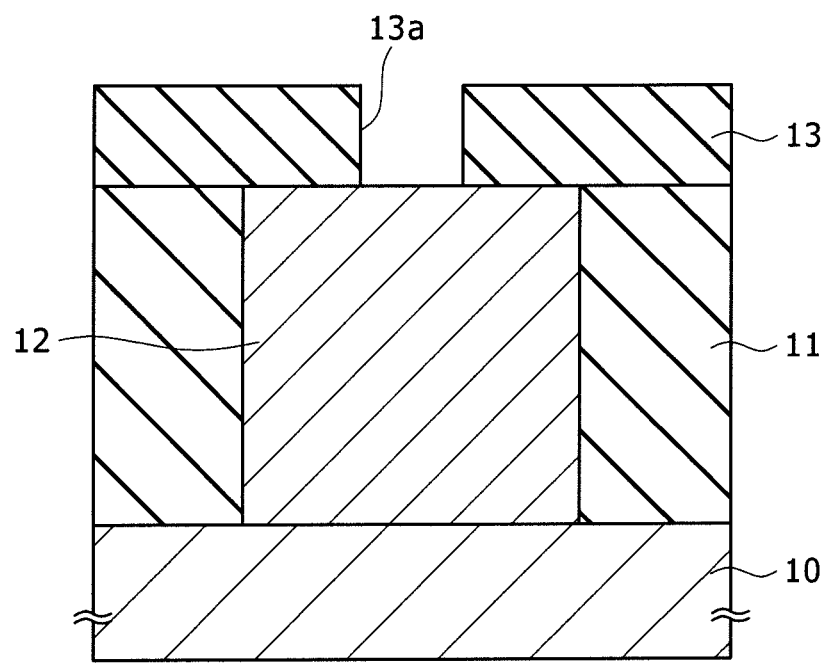
FIGS. 7A to 7F are respectively schematic cross sectional views explaining respective processes for manufacturing the memory cell of the semiconductor memory device according to the third embodiment of the present invention.

As shown in FIG. 7A, the processes up to the process shown in FIG. 2D in the first embodiment are carried out similarly to those in the case of the first embodiment.

Figure 7B:
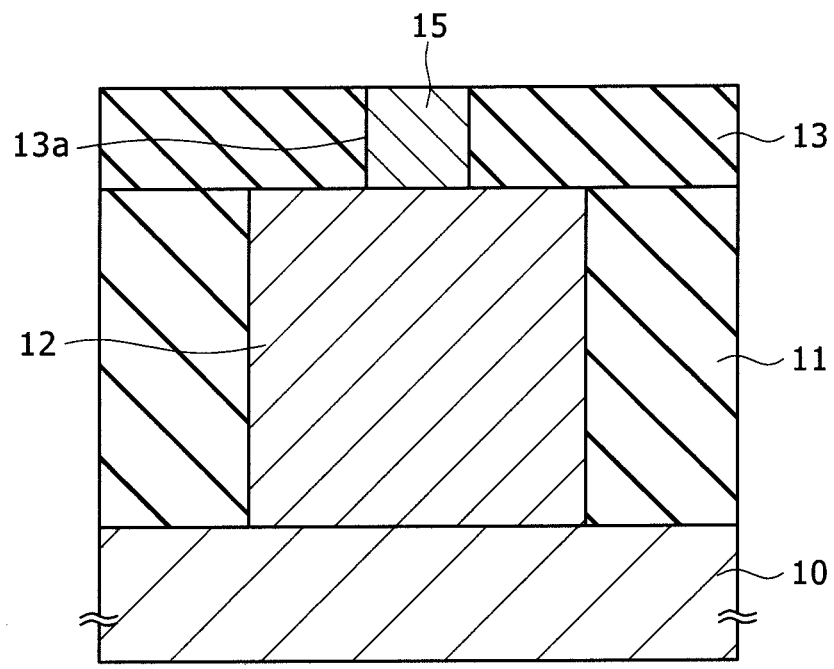

Next, as shown in FIG. 7B, a conductive material is deposited so as to be filled in the opening portion 13a by, for example, utilizing the RF sputtering method or the like, thereby forming the first electrode 15. Then, a part of the conductive material composing the first electrode 15 which is deposited outside the opening portion 13a is removed away by, for example, utilizing the CMP method or the like. As a result, there is obtained the plug-like first electrode 15 filled in the opening portion 13a.

The first electrode 15, for example, is made of a conductive material which is selected from the group including Ni, Fe, Ti, TiN, Ta, TaN, W, WN, Hf, Al, Mg, and Gd. Or, the first electrode 15 may be formed from the lamination conductive layer including both the conductive layer a material for which is selected from the group including Ni, Fe, Ti, TiN, Ta, TaN, W, WN, and the like, and the conductive layer a material for which is selected from the group including Hf, Al, Mg, Gd, and the like.

Next, when a natural oxide film is formed on the surface of the first electrode 15, the RF sputtering (reverse sputtering) is carried out in an Ar atmosphere as required, thereby removing away the natural oxide film.

Figure 7C:
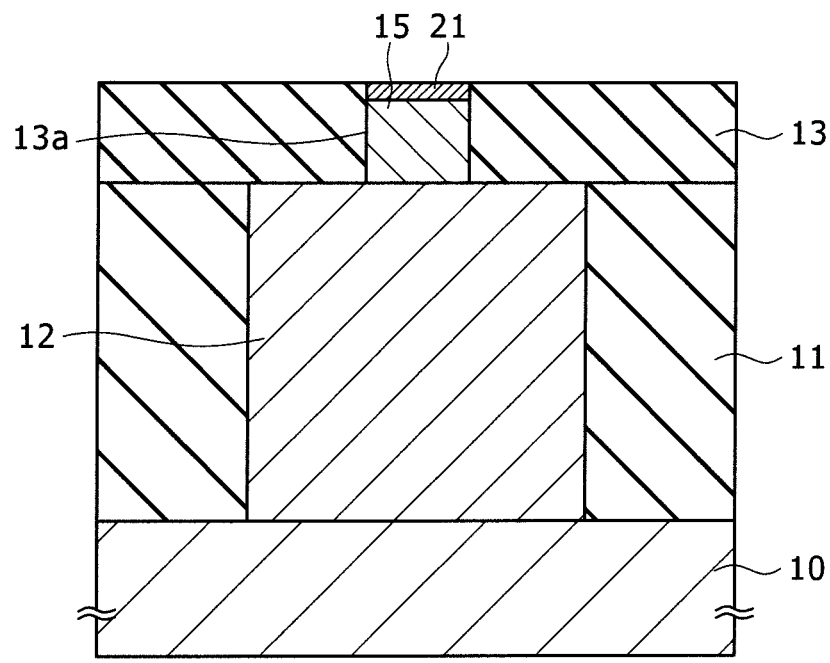

Next, as shown in FIG. 7C, for example, the surface of the first electrode 15 is oxidized, thereby forming an oxide layer 21 on the surface of the first electrode 15. A thickness of the oxide layer 21, for example, is in the range of about 1 to about 10 nm.

With regard to the method of oxidation, any of the thermal oxidation method, the plasma oxidation method, the natural oxidation method, and the like may be adopted in this case. For example, in the case of the thermal oxidation, the annealing treatment is carried out at the wafer heating temperature of 100 to 350° C. under the atmosphere containing therein oxygen. Any of the furnace annealing treatment and the Rapid Thermal Annealing (RTA) treatment may be adopted as the annealing treatment.

Figure 7D:
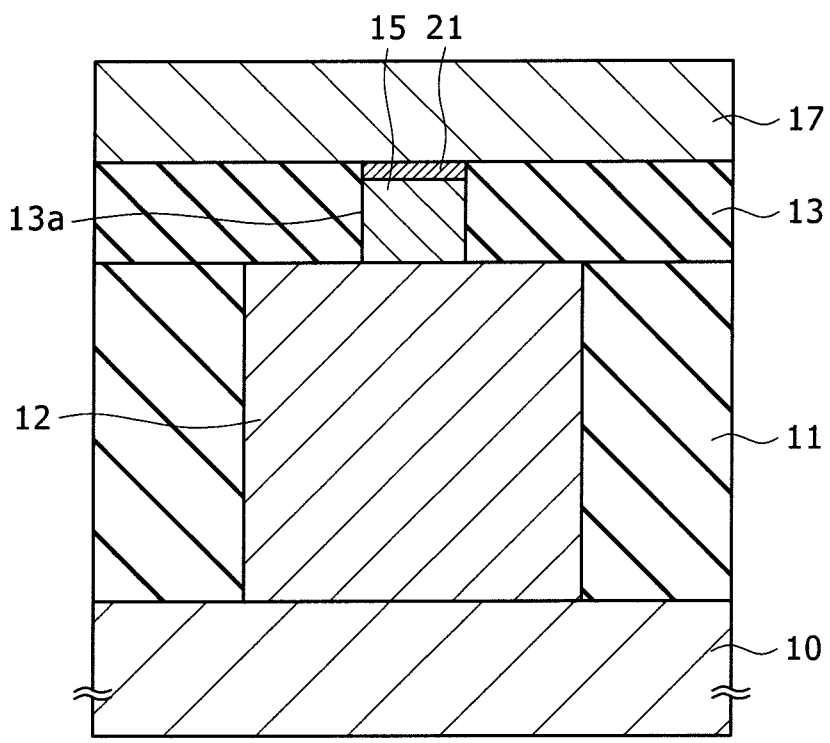

Next, as shown in FIG. 7D, the ion source layer 17 is formed on an upper layer of the first electrode 15 having the surface on which the oxide layer 21 is formed to have a thickness of about 10 to about 100 nm by, for example, utilizing the RF sputtering method.

For example, the ion source layer 17 preferably contains therein at least one kind of chalcogen element of Te, S and Se. In addition, a layer containing therein at least one kind of element of Cu, Ag and Zn is preferably formed as the ion source layer.

Here, in the third embodiment, the ion source layer 17 has to be made to contain therein an element which is easier to oxidize than that in the first electrode 15.

When the first electrode 15 is made of W, WN or the like, the ion source layer 17 is made of a material containing therein Mg, Al or the like which is easier to oxidize than W, WN or the like.

For example, the ion source layer 17 preferably contains therein at least one kind of chalcogen element of Te, S and Se. In addition, the ion source layer 17 preferably forms a layer containing therein at least one kind of element of Cu, Ag and Zn. Specifically, the ion source layer 17 can be preferably made of CuZrTe—Al.

Figure 7E:
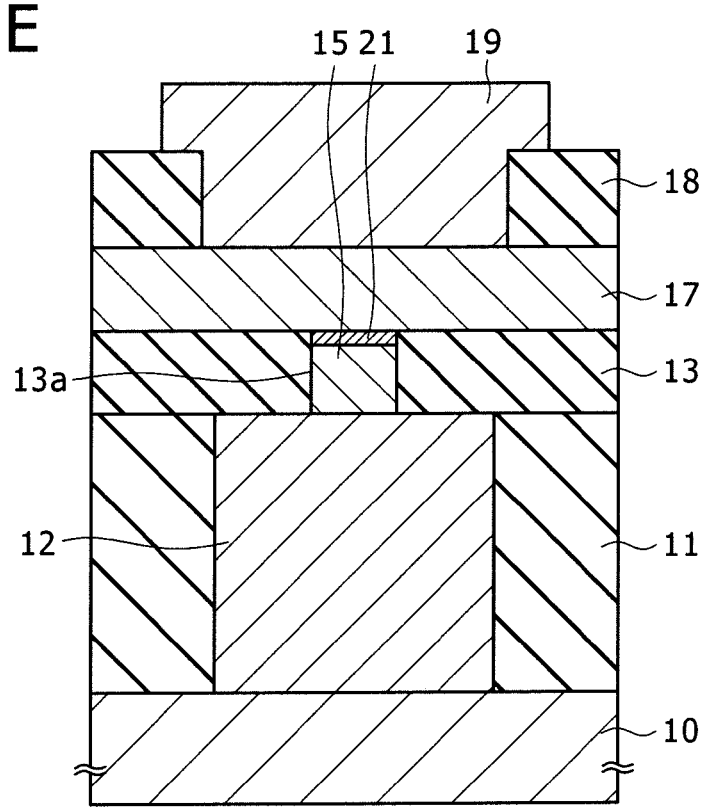

Next, as shown in FIG. 7E, for example, a third insulating film 18 is formed on the ion source layer 17, an opening portion is formed in the third insulating film 18 so as to reach the ion source layer 17, and the conductive material is filled in the opening portion, thereby forming the second electrode 19.

Figure 7F:
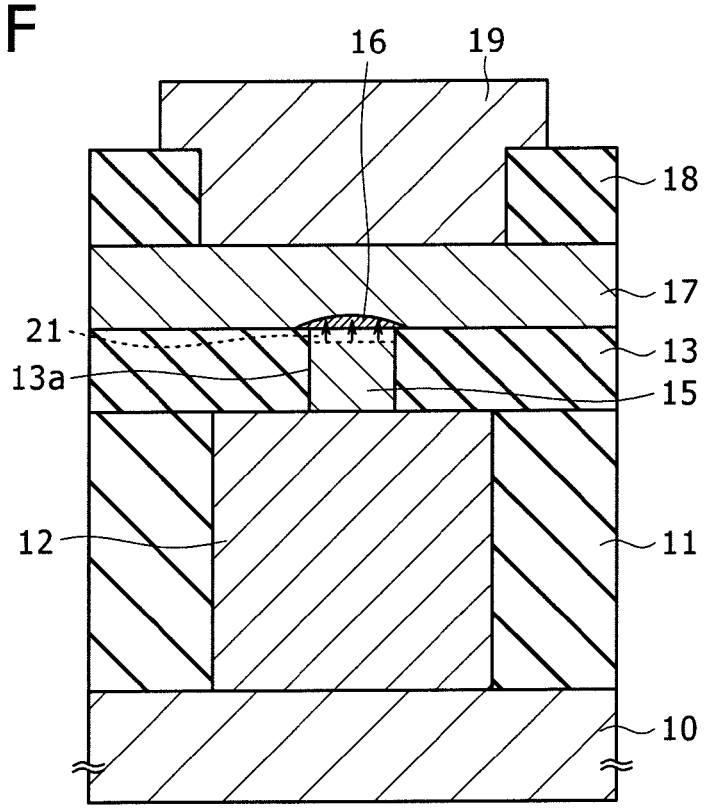

Next, as shown in FIG. 7F, by carrying out the annealing treatment, oxygen is moved from the oxide layer 21 on the first electrode 15 to the surface of the ion source layer 17 to cause to react with the metallic element contained in the ion source layer 17, for example, to cause to react with Al or Mg. As a result, the resistance change type memory layer 16 which contains therein either an aluminum oxide or a magnesium oxide as a principal component is formed.

The annealing treatment is carried out at a temperature of 200 to 450° C. in either a reduced pressure or a $N_2$ atmosphere. In this case, any of the furnace annealing treatment and the RTA treatment may be adopted as the annealing treatment.

The resistance change type memory element of the semiconductor memory device having the structure shown in FIG. 6 can be manufactured in the manner described above.

According to the method of manufacturing the resistance change type memory element of the semiconductor memory device of the third embodiment, the resistance change type memory layer 16 of the resistance change type memory element is formed by oxidizing the surface of the ion source layer 17 in the interface between the first electrode 15 and the ion source layer 17.

Since the resistance change type memory layer 16 is the layer which is formed by oxidizing the surface of the ion source layer 17, the thinning of the resistance change type memory layer 16 can be realized while the high step coverage property and the uniform thickness of the resistance change type memory layer 16 are ensured.

In the resistance change type memory element manufactured by using the method of manufacturing the semiconductor memory device of the third embodiment, the thinning of the resistance change type memory layer, and the suppression of the dispersion in electrical characteristics among the elements can be caused to be compatible with each other in the manner described above.

7. Example 1 of Third Embodiment

A resistance change type memory element was manufactured as follows in accordance with the third embodiment.

The first insulating film 11 and the lower layer wiring 12 were formed on the semiconductor substrate 10 made of silicon, the second insulating film 13 made of a silicon oxide was deposited on the first insulating film 11 and the lower layer wiring 12, and the opening portion 13a having a circular pattern having a diameter of 0.3 μm was formed in the second insulating film 13. Also, the conductive material, i.e., W was filled in the opening portion 13a to form the first electrode 15 having a thickness of 20 nm.

Next, a plasma oxidation treatment was carried out for the second insulating film 13 and the first electrode 15 to form the oxide layer 21 on the surface of the first electrode 15. The conditions of the plasma oxidation treatment were set in such a way that a pressure of $O_2$ was 1 Pa, and a power was 150 W.

Next, a layer made of $Cu_{10}Te_{40}Al_{40}Zr_{10}$ was formed as the ion source layer 17 on the first electrode 15 having the surface on which the oxide layer 21 was formed to have a thickness of 20 nm.

In addition, the third insulating film 18 was formed, and the W film was formed as the second electrode 19 to have the thickness of 200 nm.

After that, each of the ion source layer 17 deposited on the first electrode 15, and the second electrode 19 was patterned, and was then subject to a thermal treatment in a vacuum at a pressure of $5 \times 10^{-4}$ Pa or less, thereby moving oxygen from the oxide layer 21 to the surface of the ion source layer 17. As a result, the resistance change type memory layer 16 having the high resistance value was formed in the structure shown in FIG. 6.

Figure 8:
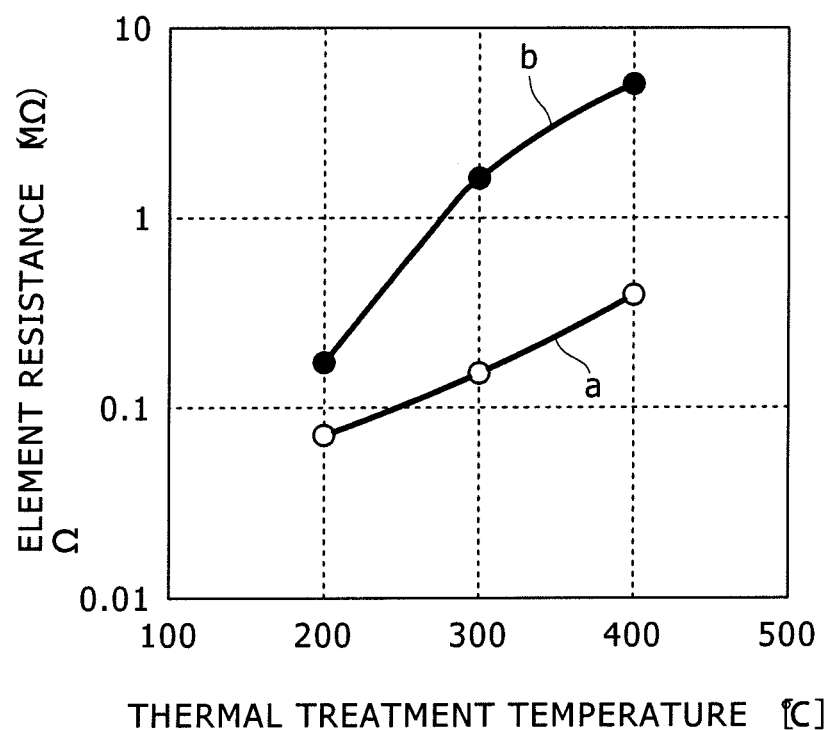
FIG. 8 is a graphical representation showing a relationship between a thermal treatment temperature and an element resistance in an example of the third embodiment.

In the manufacturing method described above, a period of time for the plasma oxidation was set as either 120 sec or 600 sec. In addition, a composition of the ion source layer 17 was set as $Cu_{10}Te_{40}Al_{40}Zr_{10}$. By setting suitably other conditions, the semiconductor memory device was manufactured. With regard to other conditions, a period of time for temperature holding was set as two hours, and in this state, the thermal treatments were carried out at three temperatures of 200° C., 300° C. and 400° C., respectively. Also, the resistance values of the semiconductor memory devices after completion of the thermal treatments at the three temperatures of 200° C., 300° C. and 400° C. were measured, respectively. The measurement results are shown in FIG. 8. In FIG. 8, "a" indicates the case where the period of time for the plasma treatment is 120 sec, and "b" indicates the case where the period of time for the plasma treatment is 600 sec. In these two cases, each of the resistance values is represented in the form of a medium of the resistance values of 2,000 elements.

As can be seen from FIG. 8, in each of the two cases indicated by "a" and "b," respectively, the resistance value increases with a rise in thermal treatment temperature. This results from that along with the rise in thermal treatment temperature, oxygen ($O_2$), and Al contained in the ion source layer 17 react with each other to form a layer made of an aluminum oxide. It is guessed from the above results that Al is made to be contained in the ion source layer 17, thereby allowing the resistance change type memory layer 16 having the high resistance value to be formed.

As shown in FIG. 8, in any of the case where the period of time for the plasma treatment is 120 sec, and the case where the period of time for the plasma treatment is 600 sec, the resistance value increases with the rise in thermal treatment temperature. In addition, it is also understood that the resistance value differs depending on the length of the period of time for the plasma oxidation.

These measurement results mean that the thickness of the high resistance memory layer 16 formed is changed depending on both the thermal treatment condition, and the period of time for the plasma oxidations.

According to an embodiment of the present invention, it is possible to enjoy the following effects.

i) It is possible to suppress the dispersion of the electrical characteristics, such as the element resistance, among the elements of the semiconductor memory devices.

ii) It is possible to suppress the dispersion of the electrical characteristics among the elements of the memory characteristics such as the writing voltage, the reading-out voltage, and the repetitive resistance.

iii) It is possible to improve the repetitive resistance by the homogenization of the resistance change type memory layer.

iv) By the thinning of the resistance change type memory layer, the operating voltage can be reduced and the power consumption can be reduced.

v) It is possible to attain the reduction of the manufacture cost by simplifying the processes for forming the resistance change type memory layer.

The present invention is by no means limited to the above description.

For example, although in each of the embodiments described above, Al is typified as the constituent element of the resistance change type memory layer, the ion source layer containing therein either Mg or a rare earth element may be used.

In addition, although in each of the embodiments described above, the ion source layer and the second electrode are made of the different materials separately from each other, the electrode may be made to contain therein an element (Cu, Ag or Zn) becoming the ion source, and thus the electrode layer may serve as the ion source layer as well.

In addition, although the movement of oxygen from the ion source layer by the oxidation potential of the metallic element is treated herein, the structure shown by the present invention can also be formed by utilizing a movement of an element adapted to have a driving force other than the driving force originating from the oxidation.

In addition thereto, the various kinds of changes can be made without departing from the subject matter of the present invention.

The present application contains subject matter related to that disclosed in Japanese Priority Patent Application JP 2009-182036 filed in the Japan Patent Office on Aug. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor memory device, comprising:
   forming a first electrode as a layer over a substrate;
   forming an ion source layer over said first electrode; and
   forming a second electrode above said ion source layer; and
   further including oxidizing at least one of a surface of said first electrode or a surface of said ion source layer to form a resistance change type memory layer in an interface between said first electrode and said ion source layer between forming said first electrode on said substrate and forming said second electrode;
   wherein said resistance change type memory cells are arranged in an array, thereby structuring said semiconductor memory device and further, wherein in the step of forming said resistance change type memory layer, a surface of said first electrode is oxidized to form said resistance change type memory layer and is comprised of an oxide of a metal from said first electrode.

2. A method of manufacturing a semiconductor memory device, comprising:
- forming a first electrode as a layer over a substrate;
- forming an ion source layer over said first electrode; and
- forming a second electrode above said ion source layer; and
- further including oxidizing at least one of a surface of said first electrode or a surface of said ion source layer to form a resistance change type memory layer in an interface between said first electrode and said ion source layer between forming said first electrode on said substrate and forming said second electrode;
- wherein said resistance change type memory cells are arranged in an array, thereby structuring said semiconductor memory device and further, further comprising:
- oxidizing a surface of said first electrode to form an oxide layer between the step of forming said first electrode on said substrate, and forming said ion source layer on the upper layer of said first electrode;
- wherein in the step of forming said resistance change type memory layer, oxygen is diffused from said oxide layer by carrying out a thermal treatment to oxidize a surface of said ion source layer, forming said resistance change type memory layer made of an oxide of a metal contained in said ion source layer.

3. A method of manufacturing a semiconductor memory device, comprising:
- forming a first electrode as a layer over a substrate;
- forming an ion source layer over said first electrode; and
- forming a second electrode above said ion source layer; and
- further including oxidizing at least one of a surface of said first electrode or a surface of said ion source layer to form a resistance change type memory layer in an interface between said first electrode and said ion source layer between forming said first electrode on said substrate and forming said second electrode;
- wherein said resistance change type memory cells are arranged in an array, thereby structuring said semiconductor memory device and further, wherein in forming said resistance change type memory layer, said resistance change type memory layer containing Al, Mg or a rare earth element is formed.

4. A method of manufacturing a semiconductor memory device, comprising:
- forming a first electrode as a layer over a substrate;
- forming an ion source layer over said first electrode; and
- forming a second electrode above said ion source layer; and
- further including oxidizing at least one of a surface of said first electrode or a surface of said ion source layer to form a resistance change type memory layer in an interface between said first electrode and said ion source layer between forming said first electrode on said substrate and forming said second electrode;
- wherein said resistance change type memory cells are arranged in an array, thereby structuring said semiconductor memory device and further, wherein in forming said ion source layer, said ion source layer containing at least one kind of chalcogen element of Te, S and Se is formed.

5. A method of manufacturing a semiconductor memory device, comprising:
- forming a first electrode as a layer over a substrate;
- forming an ion source layer over said first electrode; and
- forming a second electrode above said ion source layer; and
- further including oxidizing at least one of a surface of said first electrode or a surface of said ion source layer to form a resistance change type memory layer in an interface between said first electrode and said ion source layer between forming said first electrode on said substrate and forming said second electrode;
- wherein said resistance change type memory cells are arranged in an array, thereby structuring said semiconductor memory device and further, wherein in forming said ion source layer, said ion source layer containing at least one kind of element of Cu, Ag and Zn is formed.

* * * * *